June 1, 1965 A. P. WEINER ETAL 3,187,281

ULTRA HIGH FREQUENCY CONVERTER HAVING AUXILIARY SHIELD PREVENTING DETUNING CAUSED BY CLOSING OF COVER PLATE

Filed March 22, 1963

INVENTORS:
ALBERT P. WEINER,
ADOLF E. WOLFRAM,

BY Frank J. Thompson

THEIR ATTORNEY.

3,187,281
Patented June 1, 1965

3,187,281

ULTRA HIGH FREQUENCY CONVERTER HAVING AUXILIARY SHIELD PREVENTING DETUNING CAUSED BY CLOSING OF COVER PLATE

Albert P. Weiner, North Syracuse, and Adolf E. Wolfram, Jamesville, N.Y., assignors to General Electric Company, a corporation of New York Filed Mar. 22, 1963, Ser. No. 267,275
5 Claims. (Cl. 334—82)

Figures 1, 2, 3:
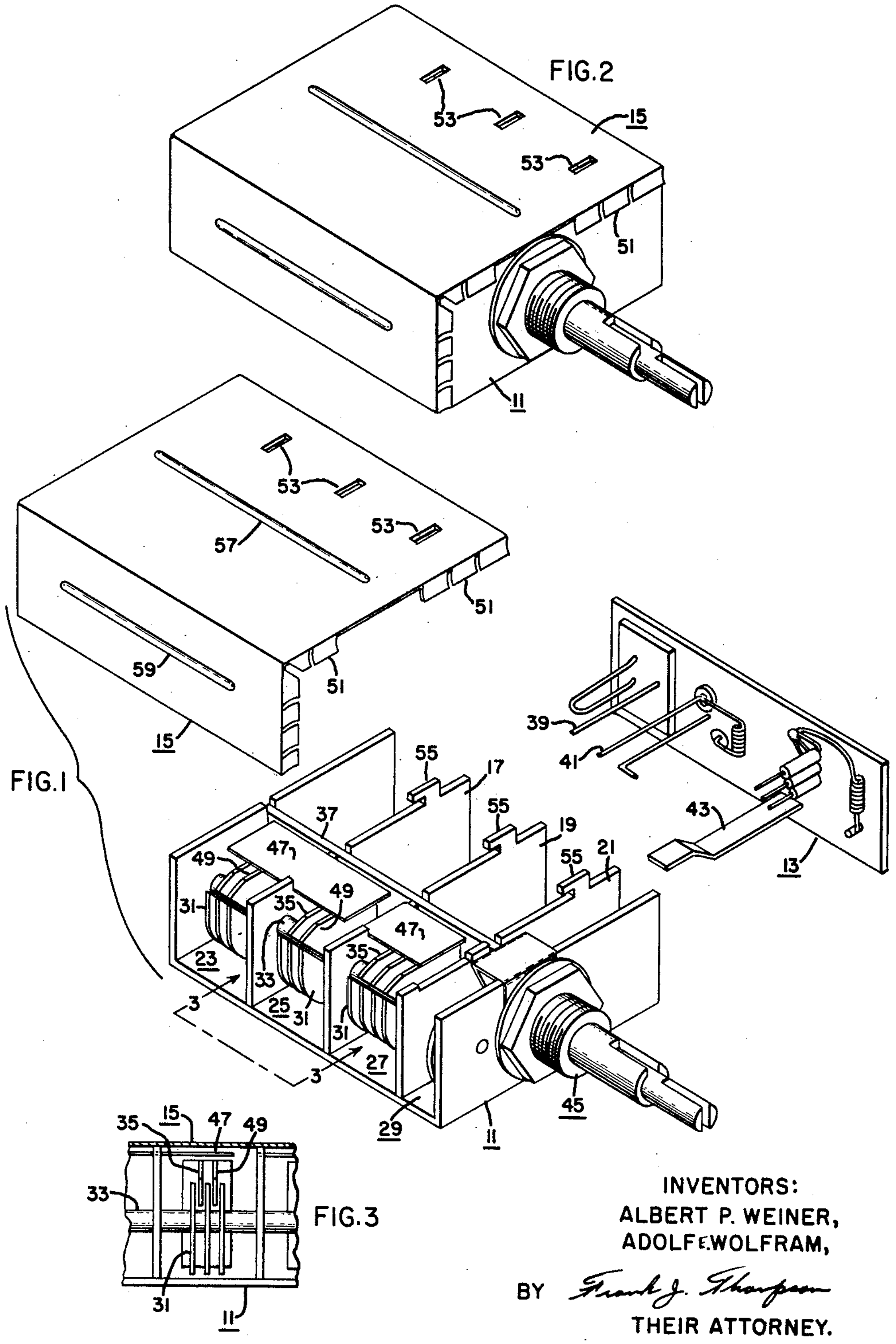

This invention relates to Ultra High Frequency converters and more particularly to an improved arrangement of tuning components and enclosure therefor.

UHF converters generally include adjustable tuning means and frequency band trimmer means for tuning signal channel frequencies within a desired band. In order to reduce radiation from the converter, for reducing construction cost, and for providing conformity with a present-day trend toward miniaturization of converters, the trimmer means is preferably positioned wholly within the enclosure along with the adjustable tuning means. The trimmer means may conveniently comprise a strip of metal for providing a trimming capacitance or inductance therebetween. Adjustment of the trimmer means is effected by bending the metal strip to a position with respect to the tuning means for providing the necessary band tuning effect. Since the trimmer means is located wholly within the enclosure, this adjustment is generally made prior to final assembly of the enclosure.

Enclosure assembly operations which occur subsequent to final adjustment of the trimmer means have been attended by adverse detuning affects on the converter. More specifically, the relatively high frequency of operation of UHF converters causes the arrangement, spacing, and wiring of components with respect to the walls of the enclosure to be critical. The metal enclosure for a UHF converter constitutes a ground plane for circuit elements mounted therein. Alterations in the effective spacing between converter components and interconnecting wiring and the enclosure, which occur subsequent to final adjustment of the trimmer means, vary a capacitance and inductance between the ground plane and the components and wiring and undesirably detune the converter. Detuning is evidenced by the inability of the converter to tune all signal channel frequencies within the desired band. Readjustment of the trimmer is then necessary for correctly retuning the converter.

In prior arrangements, the use of a relatively large converter enclosure has avoided the undesired detuning affect. For example, prior large enclosures comprise a composite two piece construction including a relatively deep shell portion for mounting the circuit components therein. The spacing between the components in the shell portion and a cover portion mounted thereto is generally sufficiently large for rendering insignificant any detuning effects which occur in final enclosure assembly. However, when the enclosure conforms with the present-day trend toward mimniaturization of the converter and maximum utilization is therefore made of available space, the components positioned in the enclosure cannot be sufficiently spaced from a subsequently mounted cover portion for rendering negligible the detuning affects caused by it.

In view of this detuning, various arrangements have been proposed for providing final trimmer adjustment while a cover is mounted to the enclosure. One arrangement provides an enclosure having trimmer access holes permanently located therein. Another arrangement utilizes a "dummy" cover having trimmer access holes therein. An aperture-free cover replaces the "dummy" cover subsequent to trimmer adjustment.

It is desirable to provide an enclosure for a UHF converter which is an effective radiation shield for containing internally generated electrical energy and which provides a dust proof atmosphere for converter circuit components. These requirements dictate that the enclosure comprise a substantially aperture-free metal box. These characteristics cannot be satisfied by the first referred-to cover-in-place enclosure arrangement while, in the "dummy" cover arrangement, the subsequent mounting of the aperture-less cover substantially varies the adjusted tuning.

Accordingly, it is an object of this invention to provide an improved trimmer tuning arrangement for a UHF converter.

Another object of this invention is to provide a trimmer arrangement for a UHF converter which substantially reduces the detuning effect created by a surface spaced relatively close thereto.

Another object of this invention is to provide a miniaturized tuner arrangement for a UHF converter which will maintain an adjusted tuning thereof when a plane of fixed potential is spaced relatively close thereto.

A further object of this invention is to provide a trimmer arrangement for a miniaturized UHF converter which is positioned wholly within a composite enclosure and which may be adjusted prior to final assembly of a cover portion yet which is substantially unsusceptible to variations in tuning upon final assembly of the enclosure.

Still another object of this invention is to provide a miniaturized UHF tuner having a composite closed enclosure and a trimmer arrangement which may be utilized with a "dummy" cover in providing final trimmer tuning adjustment thereof and which maintains an adjusted trimmer tuning when an aperture-less cover is assembled to the enclosure.

Another object of this invention is to provide a miniaturized UHF converter having an adjustable capacitive tuning element and a trimmer means positioned wholly within an enclosure and associated with the tuning element for substantially reducing detuning of the converter which is caused by a surface spaced relatively close thereto.

As hereinbefore indicated, the arrangement and spacing of components in a UHF converter is generally critical. In the referred-to composite two piece enclosures, assembly of the converter components with the required degree of care is time consuming, does not readily lend itself to mass production techniques and is consequently relatively expensive.

Accordingly, it is another object of this invention to provide an improved enclosure arrangement for a UHF converter.

Another object of this invention is to provide an enclosure for a UHF converter which facilitates assembly of the converter.

In accordance with the present invention, an adjustable signal channel tuning means is positioned in a first component part of a composite enclosure for a miniaturized converter. A surface of a second component part of the enclosure is spaced relatively close to the tuning means. Frequency band trimming means comprising a strip of metal is positioned with respect to the adjustable tuning means for providing trimming of a desired frequency band. The strip is maintained at a direct current potential, disposed intermediate the tuning means and the surface of the second component enclosure part, and arranged for providing electrical decoupling of the adjustable tuning means from the relatively closely spaced enclosure surface.

Further objects, features and the attending advantages of the invention will be apparent with reference to the following specifications and drawings in which:

FIGURE 1 is an exploded perspective view of a composite enclosure for a miniaturized converter illustrating an embodiment of the present invention, FIGURE 2 is a perspective view of the converter of FIGURE 1 in assembled form, and FIGURE 3 is a view taken along line 3—3 of FIGURE 1 with a portion of an enclosure cover shown in mounted position.

Referring now to FIGURE 1, a composite metal converter enclosure which is illustrated therein includes a base component 11, a side wall component 13, and a cover component 15. Metal plates 17, 19 and 21 are mounted to the base component 11 by any suitable means such as soldering or welding and partition the enclosure into a radio frequency compartment 23, a mixer compartment 25, an oscillator compartment 27, and a gear compartment 29. Various electrical components for selectively receiving a signal channel in the UHF frequency range, for generating a local oscillator signal and for heterodyning the received signal and the locally generated signal for providing a sum and difference frequency signal are provided in a UHF converter circuit arrangement. Only those components of such an arrangement are shown in FIGURE 1 as are believed necessary for an understanding of the present invention. A UHF converter circuit arrangement for performing the desired functions is illustrated and described in greater detail in copending application Serial No. 248,522 which was filed on December 31, 1962 and which is assigned to the assignee of this invention.

Adjustable capacitive tuning means are provided and mounted in the radio frequency, mixer, and oscillator compartments 23, 25, and 27 respectively. The adjustable tuning means comprise a plurality of capacitor rotor plates 31 mounted on a shaft 33 for rotation therewith and a plurality of stator plates 35 fixedly mounted to an insulator strip 37 and electrically coupled to other elements of a frequency responsive circuit in the converter circuit arrangement. The stator plates of compartments 23, 25 and 27 are electrically coupled to transmission lines 39, 41, 43 when the converter is assembled. A coarse and fine tuning arrangement, indicated generally as 45, gear couples rotational tuning forces to the shaft 33 in the gear compartment 29. The coarse and fine tuning arrangement is described in detail in copending application Serial No. 267,105 (38–1D–432), filed on March 22, 1963 and which is assigned to the assignee of this invention.

As indicated hereinbefore, a trimmer means is provided for adjusting the band limits of a UHF band which is to be tuned. As also was previously indicated, the final tuning adjustment which is made is generally upset in a miniaturized converter when a surface is subsequently closely spaced to the tuning means. In accordance with a feature of this invention, a trimmer means is provided and arranged for both trimming the converter to desired UHF frequency band limits and for electrically decoupling the adjustable tuning means and a surface of the enclosure which is closely spaced thereto subsequent to the trimmer adjustment. The tuning means comprise relatively thin strips of metal 47 mounted to the plates 17 and 19 by any suitable means, such as soldering, and are positioned relative to the rotor plates 35 for providing a required capacitance and inductance between the adjustable tuning means and the strips. Since the strips 47 are electrically connected to the enclosure base component 11, the strips 47 are at the direct current potential of the base 11 and represent a plane of fixed potential at the upper portion of the stators 35. This plane will decouple the tuning means from a surface such as the cover 15 positioned above the tuning means and occupying an area substantially equal to the area of the strips 47. The term decoupling as utilized in these specifications and the accompanying claims is understood to mean a reduction in alternating current coupling, either capacitive, inductive or combinations of both which would ordinarily exist between the subsequently mounted surface such as the cover 15 and the tuning means in the absence of strips 47.

In assembling the converter, a "dummy" cover having apertures slightly larger than the tuner strips is mounted to the base 11 subsequent to the assembly of side wall 13. The adjustment of the trimmers are made by bending the strips 47 toward or away from the stators 35 as necessary. Subsequent replacement of the "dummy" cover with an aperture-less cover has an insignificant effect on the adjusted tuning of the converter.

For reducing coupling between the surface of the cover 15 and the stator plates 35, the stator plates are arranged to have edges increasingly spaced away from the surface 15 in the region beyond the surface area of the strip 47 as indicated by segments 49. Thus, the increasing separation between the surface 15 and the plates 35 contributes to a reduction in coupling inductance and capacitance therebetween.

In accordance with another feature of the present invention, an inexpensive converter arrangement is provided for assembling a miniaturized UHF converter. A modular construction permits the jig assembly of a majority of converter circuit components on the side wall component 13. Both because of the miniaturization of the converter and care with which the components must be arranged and spaced, the mounting of the components to the side wall reduces the time and consequently the cost of the necessary careful assembly. The side wall component 13 is then seam-soldered to the base component 11. Electrical solder connections are then made between the components perivously mounted on side wall 13 and other elements mounted to the base component 11. The cover component 15 is subsequently mounted to provide a completed assembly as is illustrated in FIGURE 2.

Cover component 15 is arranged for mounting to the enclosure without the customary seam-soldering. The cover 15 includes a plurality of mechanical grasping tabs 51 spaced along the periphery of the cover. Each of the tabs has an arctuate surface for exerting side forces on the base component 11. These tabs provide electrical connection between the cover 15 and base 11. Slots 53 are provided in the cover and cooperate with mounting tabs 55 on plates 17, 19, and 21 for securing the cover to the base 11. Two formed ribs 57 and 59 act as stiffeners for the cover and provide electrical connection at the plates 17, 19 and 21. The cover 15 may thus be fabricated from a gage of metal substantially lighter than the base and side wall components 11 and 13.

While we have illustrated and described and have pointed out in the annexed claims certain novel features of our invention, it will be understood that various omissions, substitutions, and changes in the forms and details of the system illustrated may be made by those skilled in the art without departing from the spirit of the invention and the scope of the claims.

What we claim is:

1. In a frequency converter a band trimmer arrangement comprising: a composite enclosure for the converter, said enclosure having first and second components thereof; an adjustable tuning means for the converter positioned in said first enclosure component; said second enclosure component having a surface area segment spaced from said tuning means and maintained at a constant potential; and means comprising a relatively flat metal strip mounted in said enclosure and disposed between said tuning means and said surface area segment in a plane parallel to said surface and maintained at a constant potential, said strips spaced from said tuning means for providing trimming of a desired frequency band, said strip having a surface area adapted for providing decoupling between said tuning means and said surface area portion.

2. In a frequency converter, a band trimmer arrangement comprising: a composite converter enclosure having base and cover components; adjustable capacitive tuning means comprising associated rotor and stator segments positioned in said base component; said cover component having a surface area segment positioned with respect to said tuning means and maintained at a fixed potential; and frequency band trimmer means comprising a strip of metal positioned relative to said capacitive tuning means in a plane parallel to said cover surface area segment and spaced from said tuning means for providing tuning of a desired frequency band; means electrically connecting said strip to said base component for establishing said strip at a same fixed potential as said base; said strip having a surface area adapted for providing decoupling between said tuning means and said cover surface area segment.

3. In a frequency converter adapted for tuning signal frequencies in a desired band of frequencies, a band trimmer arrangement comprising: a composite enclosure for the converter having a base component and cover component mounted thereto; adjustable capacitive tuning means comprising associated parallel rotor and stator plates positioned in said enclosure; said capacitor plates positioned in planes substantially perpendicular to a surface area segment of said cover component; and frequency band trimmer means comprising a strip of metal mounted within said enclosure and positioned between said capacitor and cover in a plane parallel to a surface area segment of said cover, said strip spaced from said capacitor plates for providing trimming of a desired frequency band, means electrically connecting said strips to said base component for maintaining said strips at a same potential as said base, said strips having a surface area adapted for providing decoupling between said tuning means and said cover surface area segment.

4. The apparatus of claim 3 wherein said rotor plates including edge segments thereof positioned substantially parallel to said cover and edge segments thereof extending away from said cover, and said strip has a cross-sectional area extending at least over all the edge segments which are parallel to the cover.

5. In a frequency converter adapted for tuning signal frequencies in a desired ultra high frequency band of frequencies, a band trimmer arrangement comprising: a composite enclosure for the converter, said enclosure including a base component having a base portion and first and second oppositely disposed folded over walls; a wall component having electric components assembled thereto and seam-soldered to said base component; a cover component having a cover segment and a folded over side wall segment; a plurality of metal plates positioned in said enclosure for partitioning said enclosure into a plurality of compartments; a variable capacitor positioned in a compartment; said capacitor including a plurality of associated parallel rotor and stator plates; said plates positioned in planes perpendicular to a surface area segment of said cover component; a band trimmer strip mounted to a partition plate and disposed between said stator plates and said cover surface area segment in a plane parallel to said surface; said strip spaced from said capacitor plates for providing desired tuning of a frequency band; said strip having a surface area adapted for decoupling said capacitor plates from said cover surface area segment.

References Cited by the Examiner

UNITED STATES PATENTS

| | | | |
|---|---|---|---|
| 854,045 | 5/07 | La Paugh | 220—3.8 |
| 2,130,243 | 9/38 | Mitchell | 174—35.2 |
| 2,422,454 | 6/47 | Weiss | 334—82 |
| 2,759,158 | 8/56 | Puerner et al. | 334—85 |
| 2,835,816 | 5/58 | Shapiro et al. | 334—82 |
| 2,875,338 | 2/59 | Holmes | 334—85 |
| 2,924,639 | 2/60 | Zelt | 174—50 |
| 3,026,453 | 3/62 | Marks | 317—101 |
| 3,048,747 | 8/62 | Errichiello | 317—101 |

HERMAN KARL SAALBACH, *Primary Examiner.*